(12) United States Patent
Jiang et al.

(10) Patent No.: US 12,356,628 B2
(45) Date of Patent: Jul. 8, 2025

(54) MEMORY DEVICE AND METHOD FOR MAKING SAME

(71) Applicant: Taiwan Semiconductor Manufacturing Company, Ltd., Hsinchu (TW)

(72) Inventors: Yu-Wei Jiang, Hsinchu (TW); Hung-Chang Sun, Kaohsiung (TW); Sheng-Chih Lai, Hsinchu County (TW); Kuo-Chang Chiang, Hsinchu (TW); Tsuching Yang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 56 days.

(21) Appl. No.: 18/473,174

(22) Filed: Sep. 22, 2023

(65) Prior Publication Data

US 2024/0015980 A1   Jan. 11, 2024

Related U.S. Application Data

(62) Division of application No. 17/190,436, filed on Mar. 3, 2021, now Pat. No. 11,903,213.

(60) Provisional application No. 63/057,893, filed on Jul. 29, 2020.

(51) Int. Cl.
*H10B 51/20* (2023.01)
*H10B 43/10* (2023.01)
*H10B 43/27* (2023.01)
*H10B 51/10* (2023.01)

(52) U.S. Cl.
CPC ............. *H10B 51/20* (2023.02); *H10B 43/10* (2023.02); *H10B 43/27* (2023.02); *H10B 51/10* (2023.02)

(58) Field of Classification Search
CPC ............................... H10B 51/20; H10B 43/10
See application file for complete search history.

(56) References Cited

U.S. PATENT DOCUMENTS 8,658,499 B2 * 2/2014 Makala ............... H01L 29/7889
257/334
9,209,247 B2  12/2015 Colinge et al.
9,236,267 B2   1/2016 De et al.
(Continued)

FOREIGN PATENT DOCUMENTS

WO   WO-2020086566 A1 *  4/2020  ......... H01L 27/0688

*Primary Examiner* — Vincent Wall
(74) *Attorney, Agent, or Firm* — JCIPRNET

(57) ABSTRACT

A memory device includes transistor structures and memory arc wall structures. The memory arc wall structures are embedded in the transistor structures. The transistor structure includes a dielectric column, a source electrode and a drain electrode, a gate electrode layer and a channel wall structure. The source electrode and the drain electrode are located on opposite sides of the dielectric column. The gate electrode layer is around the dielectric column, the source electrode, and the drain electrode. The channel wall structure is extended from the source electrode to the drain electrode and surrounds the dielectric column. The channel wall structure is disposed between the gate electrode layer and the source electrode, between the gate electrode layer and the drain electrode, and between the gate electrode layer and the dielectric column. The memory arc wall structure is extended on and throughout the channel wall structure.

20 Claims, 19 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,859,337 B2 * | 1/2018 | Ratnam .................. H01L 23/528 |
| 10,115,897 B1 * | 10/2018 | Sato ...................... H10N 70/823 |
| 10,381,409 B1 * | 8/2019 | Zhou ..................... H10N 70/841 |
| 10,381,559 B1 * | 8/2019 | Zhou ..................... H10N 70/841 |
| 10,593,697 B1 * | 3/2020 | Hu ....................... H01L 29/7926 |
| 10,707,121 B2 * | 7/2020 | Liu ........................ H10B 41/50 |
| 10,720,503 B2 * | 7/2020 | Ching .............. H01L 29/78696 |
| 10,903,232 B2 * | 1/2021 | Tsutsumi ............... H10B 43/35 |
| 10,950,627 B1 * | 3/2021 | Hinoue ................. H10B 41/35 |
| 10,985,171 B2 * | 4/2021 | Kaneko ........... H01L 29/40117 |
| 11,018,151 B2 * | 5/2021 | Kaneko ............. H01L 21/31111 |
| 11,289,157 B1 * | 3/2022 | Chen ................. G11C 13/0007 |
| 11,527,552 B2 * | 12/2022 | Lu ........................... H10B 51/10 |
| 11,631,686 B2 * | 4/2023 | Said ..................... H10D 64/667 257/321 |
| 11,640,974 B2 * | 5/2023 | Chiang ............. H01L 29/78391 257/295 |
| 2013/0307053 A1 * | 11/2013 | Polishchuk ......... H01L 29/7926 257/E29.262 |
| 2013/0309826 A1 * | 11/2013 | Ramkumar ......... H01L 29/4234 438/269 |
| 2016/0071861 A1 * | 3/2016 | Serov ..................... H10D 30/63 438/257 |
| 2017/0025431 A1 * | 1/2017 | Kanakamedala .... H10D 30/696 |
| 2017/0148805 A1 * | 5/2017 | Nishikawa ............. H10B 41/35 |
| 2017/0148809 A1 * | 5/2017 | Nishikawa ........... H01L 23/528 |
| 2018/0040623 A1 * | 2/2018 | Kanakamedala .... H10D 30/689 |
| 2019/0252405 A1 * | 8/2019 | Tsutsumi ............... H10B 43/10 |
| 2019/0371803 A9 * | 12/2019 | Kanakamedala .... H10D 30/689 |
| 2020/0006376 A1 * | 1/2020 | Makala .................. H10B 43/10 |
| 2020/0144308 A1 * | 5/2020 | Yakubo ................. H10B 41/27 |
| 2021/0013229 A1 * | 1/2021 | Sakuma .............. G11C 11/2275 |
| 2022/0037363 A1 * | 2/2022 | Jiang .................... H10B 51/20 |
| 2023/0371266 A1 * | 11/2023 | Kajimoto .......... H01L 29/78391 |

\* cited by examiner

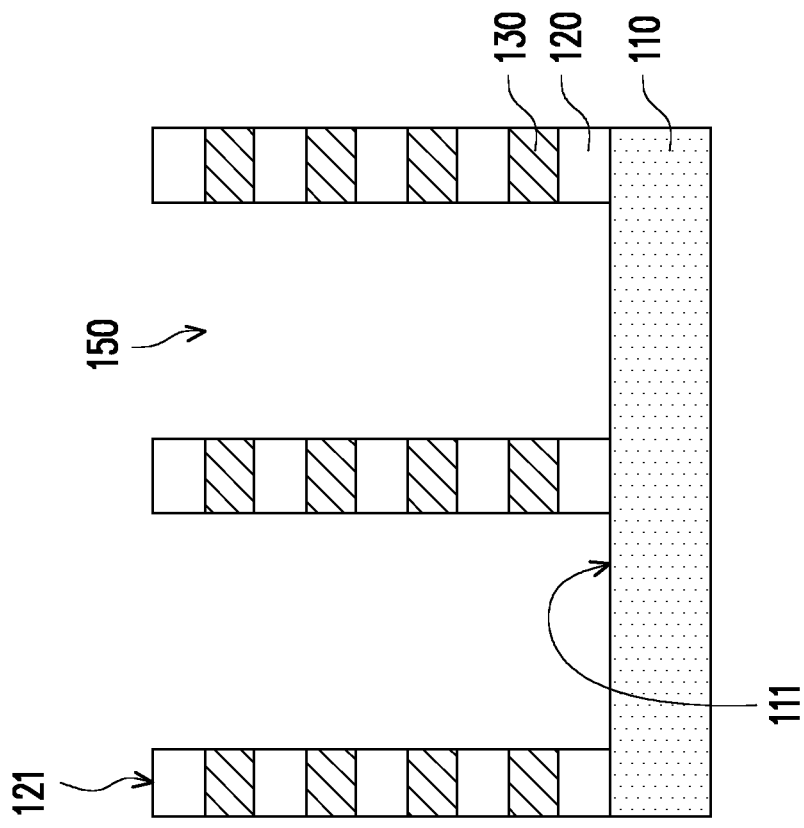
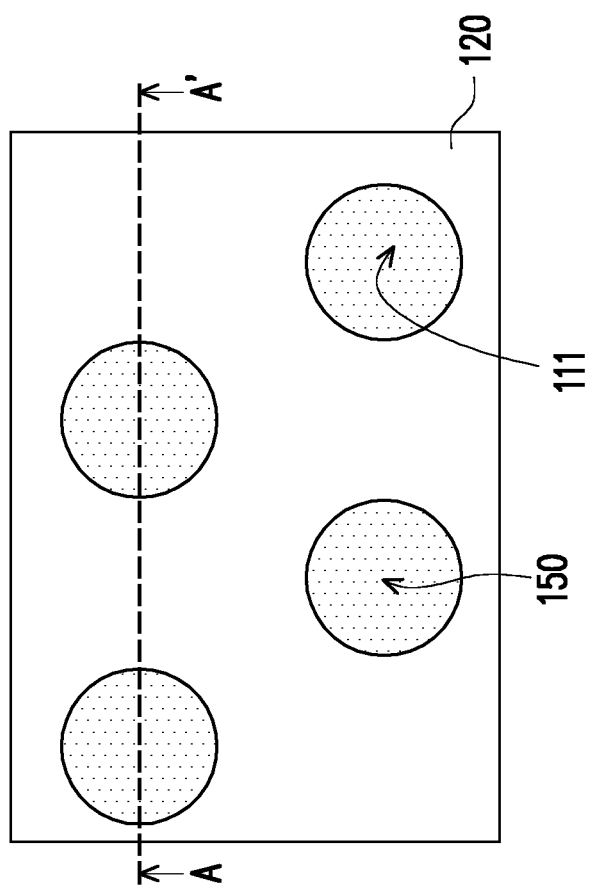
FIG. 3B
FIG. 3A

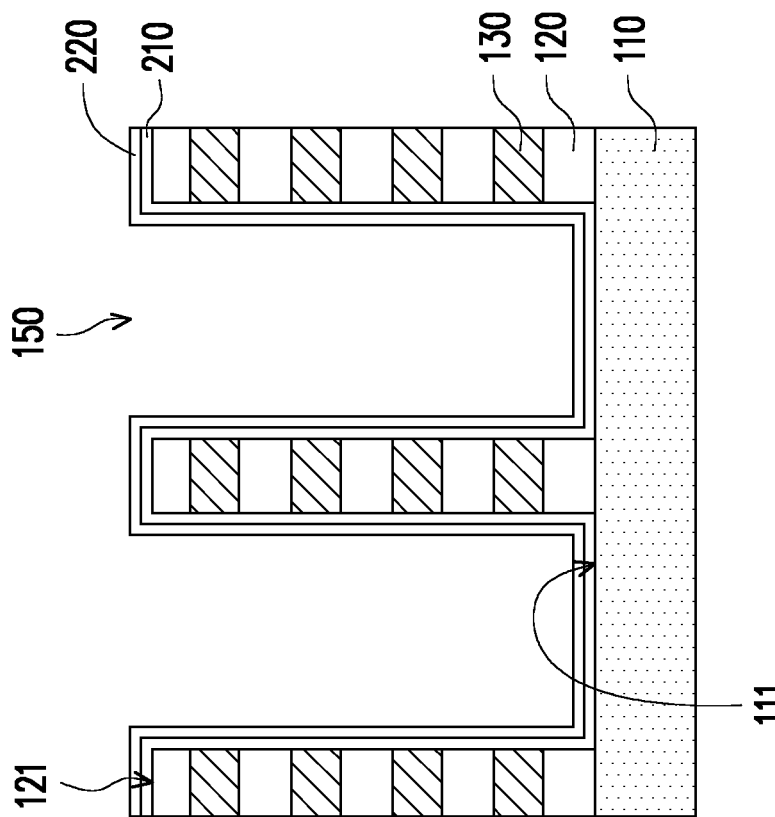
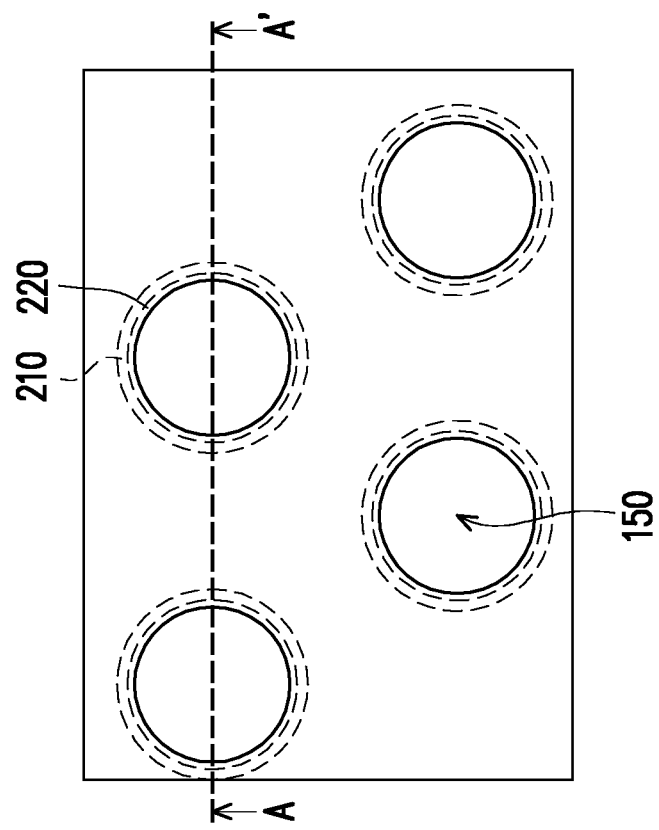
FIG. 4B
FIG. 4A

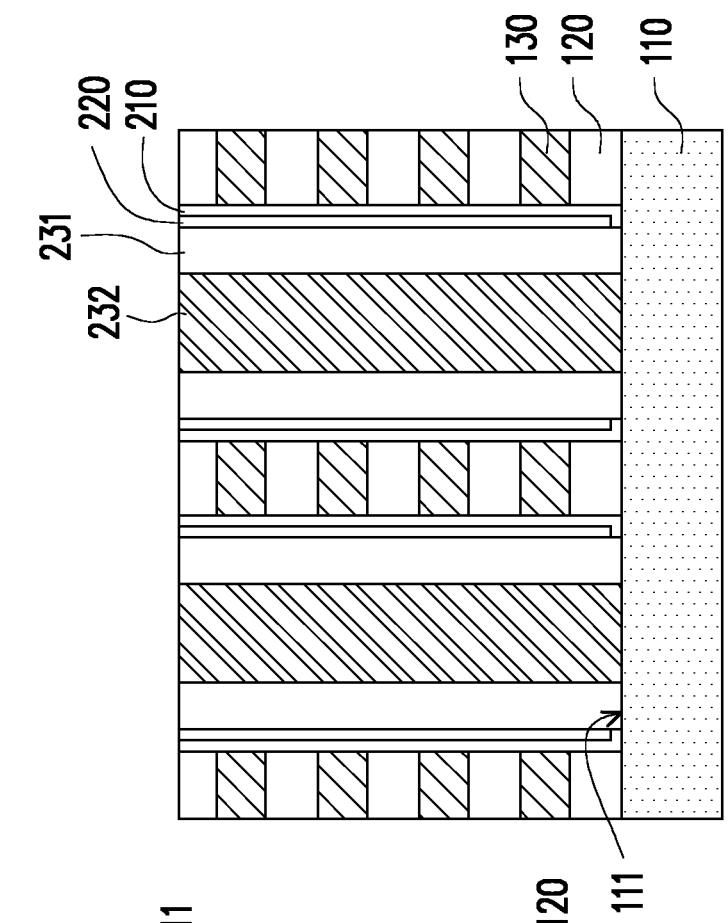
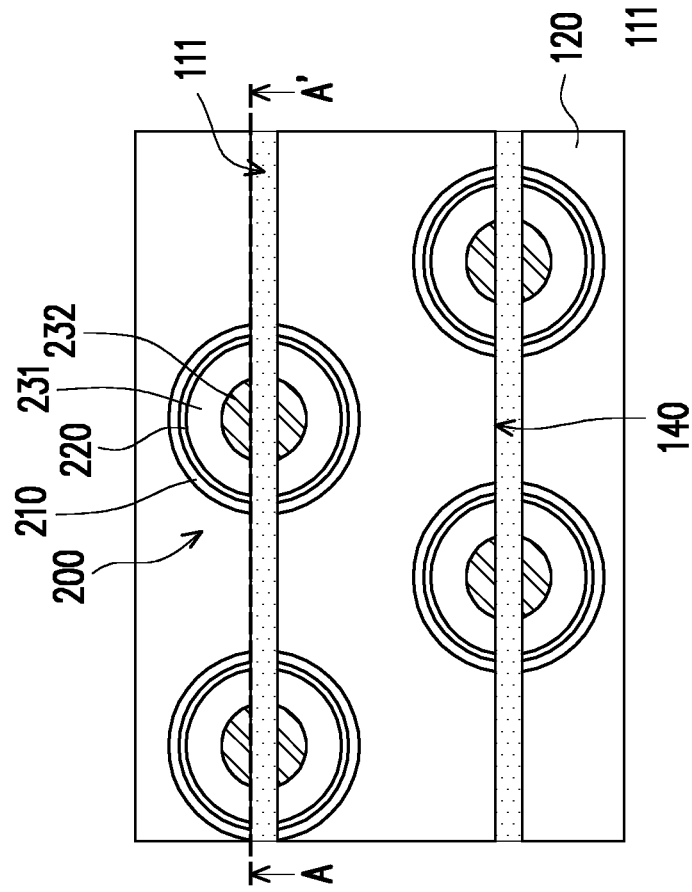
FIG. 7A
FIG. 7B

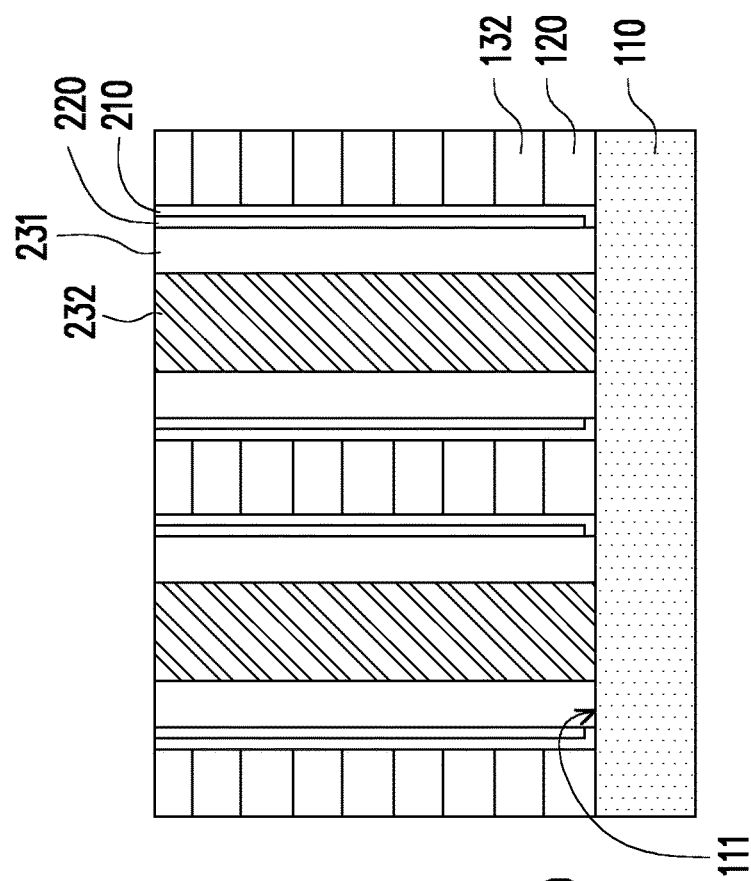
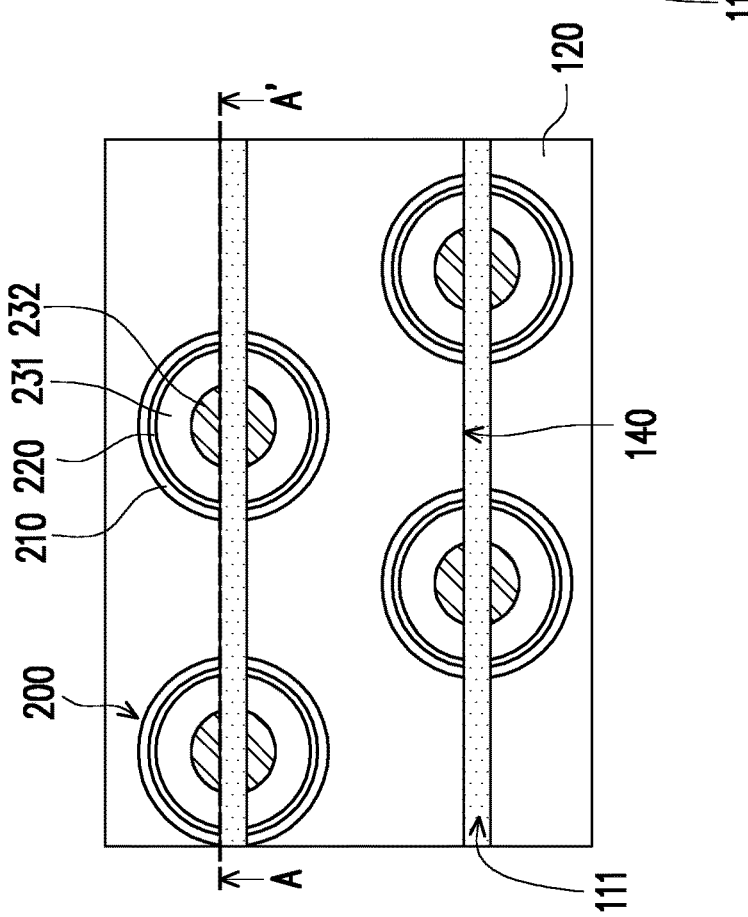
FIG. 8B
FIG. 8A

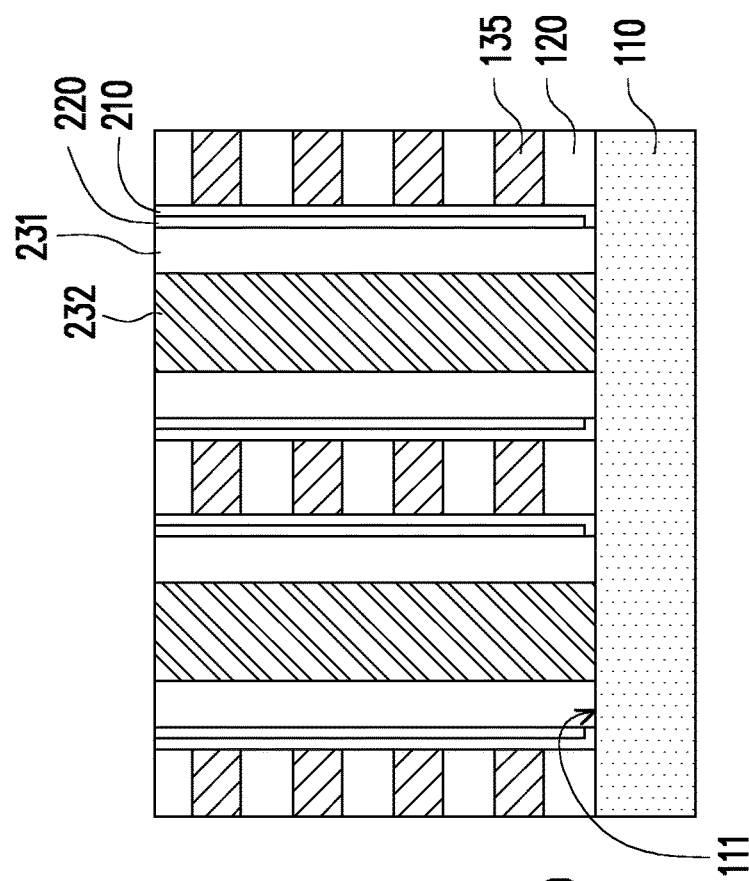
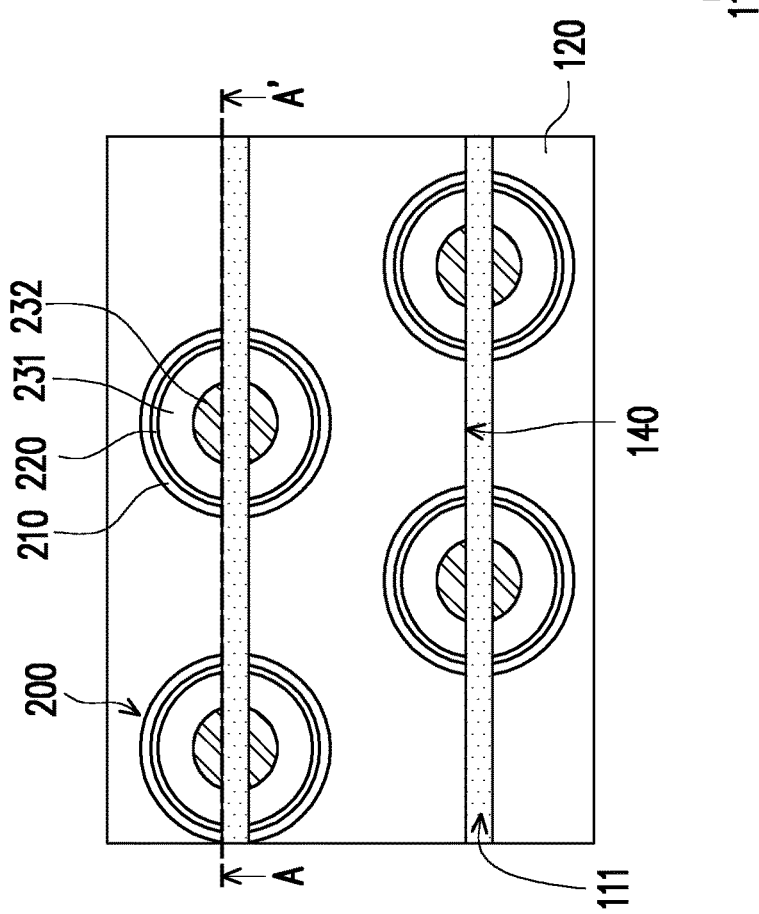
FIG. 9B
FIG. 9A

MEMORY DEVICE AND METHOD FOR MAKING SAME

CROSS-REFERENCE TO RELATED APPLICATION

This application is a divisional application of and claims the priority benefit of U.S. patent application Ser. No. 17/190,436, filed on Mar. 3, 2021. The prior application Ser. No. 17/190,436 claims the priority benefit of U.S. provisional application Ser. No. 63/057,893, filed on Jul. 29, 2020. The entirety of the above-mentioned patent application is hereby incorporated by reference herein and made a part of this specification.

BACKGROUND

A memory device is formed as an array of memory elements throughout multiple layers stacked above a semiconductor substrate. The stack of memory elements forms a high integration density of a three-dimensional (3D) non-volatile memory device that is used in various electronic apparatuses such a memory chip, a solid state drive, or a storage device for various computational applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is a schematic top view illustrating a memory device for a manufacturing step thereof in accordance with some embodiments of the disclosure.

FIG. 3B is a schematic cross-section view illustrating a memory device for a manufacturing step thereof along an AA' line in FIG. 3A in accordance with some embodiments of the disclosure.

FIG. 4A is a schematic top view illustrating a memory device in accordance with some embodiments of the disclosure.

FIG. 4B is a schematic cross-section view illustrating a memory device for a manufacturing step thereof along an AA' line in FIG. 4A in accordance with some embodiments of the disclosure.

FIG. 7A is a schematic top view illustrating a manufacturing step of a memory array in accordance with some embodiments of the disclosure.

FIG. 7B is a schematic cross-section view illustrating a manufacturing step of a memory array along a A-A' line shown in FIG. 7A in accordance with some embodiments of the disclosure.

FIG. 8A is a schematic top view illustrating a manufacturing step of a memory array in accordance with some embodiments of the disclosure.

FIG. 8B is a schematic cross-section view illustrating a manufacturing step of a memory array along a A-A' line shown in FIG. 8A in accordance with some embodiments of the disclosure.

FIG. 9A is a schematic top view illustrating a manufacturing step of a memory array in accordance with some embodiments of the disclosure.

FIG. 9B is a schematic cross-section view illustrating a manufacturing step of a memory array along a A-A' line shown in FIG. 9A in accordance with some embodiments of the disclosure.

DETAILED DESCRIPTION

Figure 1A:
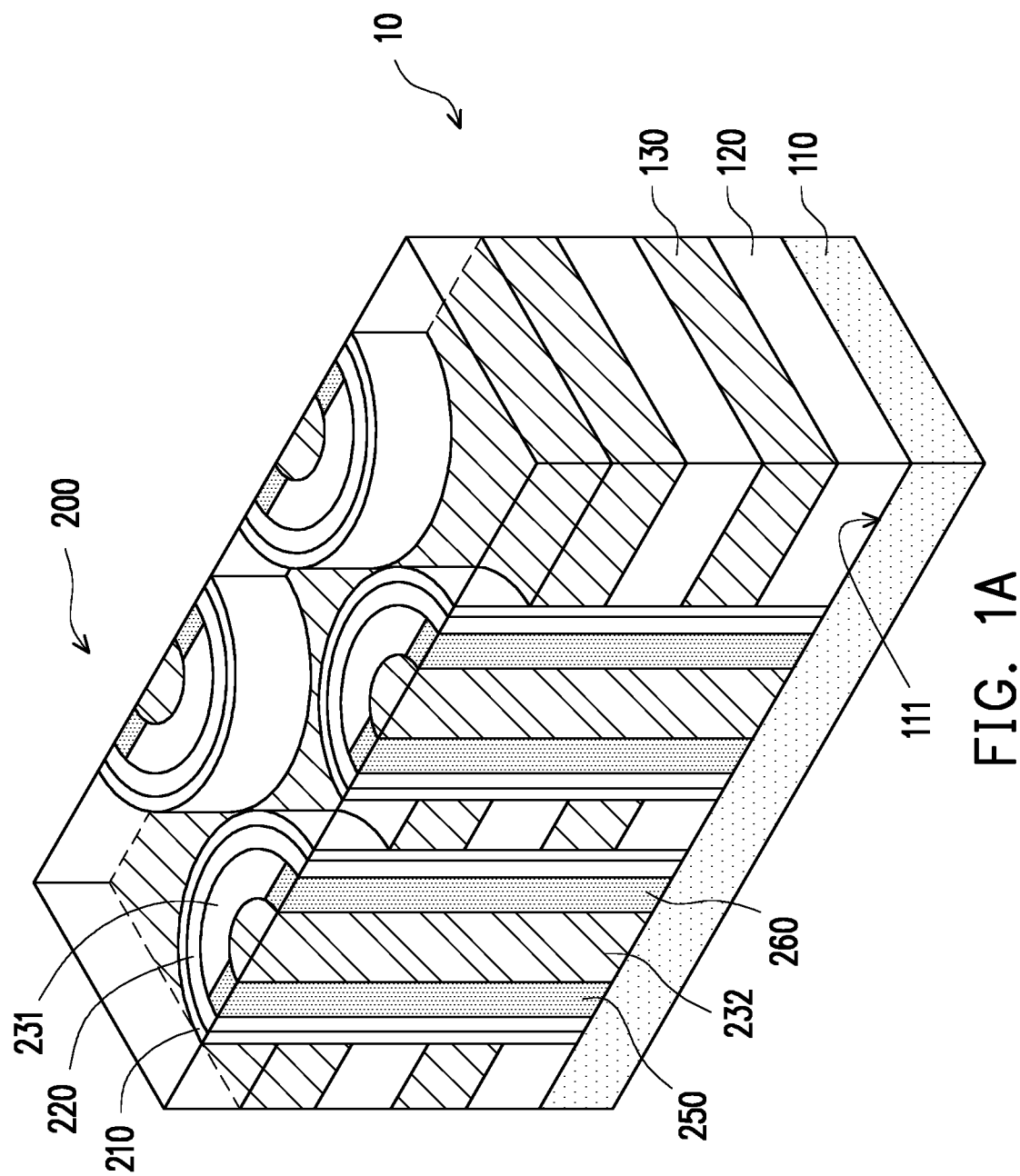
FIG. 1A is a schematic three-dimensional (3D) view illustrating a memory device in accordance with some embodiments of the disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
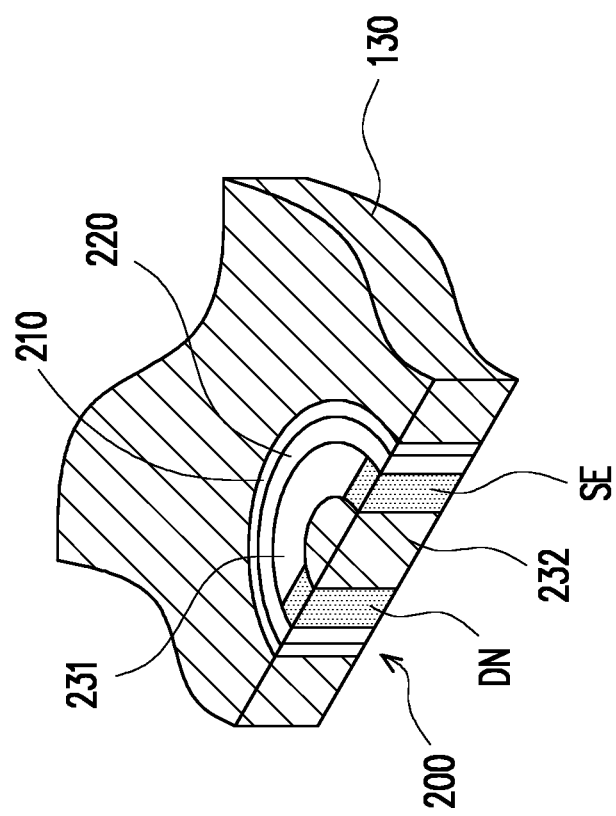
FIG. 1B is a schematic three-dimensional (3D) view illustrating a memory cell in accordance with some embodiments of the disclosure.

FIG. 1A is a schematic three-dimensional (3D) view illustrating a memory device in accordance with some embodiments of the disclosure. FIG. 1B is a schematic three-dimensional (3D) view illustrating a memory cell 200 in accordance with some embodiments of the disclosure. Referring to FIG. 1A and FIG. 1B, in some embodiments, the memory device 10 includes a plurality of memory cells 200 having transistor structures with a plurality of memory arc wall structures 210 respectively embedded therein. Each of the transistor structures 200 can include a dielectric column having a first dielectric column 231 and a second dielectric column 232, a drain electrode DN, a source electrode SE, a gate electrode layer 130, and a channel wall structure 220. As shown in FIG. 1B, the first dielectric column 231, the second dielectric column 232, the drain electrode DN, the source electrode SE, and the channel wall structure 220 are surrounded by a memory arc wall structure 210.

As illustrated in FIG. 1B, the drain electrode DN and the source electrode SE are respectively located on the opposite sides of the second dielectric column 232. Moreover, in the transistor structure 200, the gate electrode layer 130 is disposed around the first dielectric column 231, the second dielectric column 232, the drain electrode DN, and the source electrode SE. In addition, referring to FIG. 1B, the channel wall structure 220 is disposed between the gate electrode layer 130 and the first dielectric column 231. The channel wall structure 220 extends from the source electrode SE to the drain electrode DN and surrounds the first dielectric column 231 and the second dielectric column 232.

Referring to FIG. 1A and FIG. 1B, in some embodiments, the source electrode SE in each of the transistor structures 200 is a portion of a source line electrode 260. The source line 260 is extended vertically along the first dielectric column 231 and the second dielectric column 232. In addition, the drain electrode DN of each of the transistor structures 200 is a portion of a bit line electrode 250. The bit line electrode 250 is extended vertically along the first dielectric column 231 and the second dielectric column 232 and parallelly with the source line electrode 260. In the present embodiment, the memory cells having the transistor structures 200 may be repetitively and vertically disposed along the stacking direction of the insulating layers 120 and the gate electrode layers 130 to form a plurality of strings of the memory cells 200.

In some embodiments, referring again to FIG. 1B, the channel wall structure 220 is disposed between the gate electrode layer 130 and the source electrode SE, between the gate electrode layer 130 and the drain electrode DN, and between the gate electrode layer 130 and the first dielectric column 231. In some embodiments, the memory arc wall structure 210 extends on and throughout the stack of the insulating layers 120 and the gate electrode layers 130, and the memory arc wall structure 210 is sandwiched between the gate electrode layer 130 and the channel wall structure 220.

Referring to FIG. 1A and FIG. 1B, a plurality of the memory cells 200 are respectively formed within the overlapping regions of the memory arc wall structure 210 and the gate electrode layers 130. The strings of the memory cells 200 are formed vertically along the stacking direction of the insulating layers 120 and the gate electrode layers 130. In some embodiments, two adjacent memory cells 200 disposed along the stacking direction are isolated and separated by the insulating layers 120 disposed therebetween.

In some embodiments, referring to FIG. 1A and FIG. 1B, the memory cells 200 can form a memory structure that includes the stack of the insulating layers 120 and the gate electrode layers 130 in alteration. The memory structure includes the mentioned first dielectric column 231 and the second dielectric column 232. Besides, the memory structure includes the source electrode SE and the drain electrode DN that are respectively disposed on the opposite sides of the second dielectric column 232. Moreover, the memory structure also includes the memory arc wall structure 210 and the channel wall structure 220. The second dielectric column 232, penetrating through the stack of the insulating layers 120 and the gate electrode layers 130, is disposed alongside the first dielectric column 231, the bit line electrode 250, and the source line electrode 260. The first dielectric column 231 surrounds the second dielectric column 232, the bit line electrode 250, and the source line electrode 260. As shown in FIG. 1A and FIG. 1B, the memory arc wall structure 210 surrounds the first dielectric column 231 and extends from the bit line electrode 250 to the source line electrode 260.

Referring again to FIG. 1A and FIG. 1B, in some embodiments, the channel wall structure 220 penetrates through the stack of the insulating layers 120 and the gate electrode layers 130 and is surrounded by the memory arc wall structure 210. The channel wall structure 220 is disposed between the memory wall arc structure 210 and the second dielectric column 232. Moreover, the memory arc wall structure 210 is sandwiched between the gate electrode layer 120 and the channel wall structure 220.

In some embodiments, the substrate 110 is a semiconductor substrate such as a silicon, an indium phosphide (InP), a germanium (Ge), a gallium arsenide (GaAs), a gallium arsenide phosphide (GaAsP), or a silicon germanium (SiGe) substrate.

In some embodiments, the insulating layers 120 are isolation layers disposed between each two of the adjacent gate electrode layers 130. In some embodiments, the insulating layers 120 can include a dielectric material adapted for electrically isolating adjacent gate electrode layers 130, for example, silicon nitride ($SiN_x$), silicon oxide ($SiO_x$), silicon oxynitride ($SiO_xN_y$), MgO, aluminum oxide ($Al_2O_3$), silicon carbide, or a combination thereof. In some other embodiments, the insulating layers 120 can include low-k dielectric materials, for example, carbon doped silicon oxide or porous silicon oxide. In some embodiments, the insulting layers 120 can also include airgaps for insulation.

In some embodiments, the gate electrode layers 130 are conductive layers including one or more conductive materials containing semiconductor materials such as polysilicon material or metal materials. In some embodiments, the metal materials used for the gate electrode layer 130 may be chosen from a group including Cu, Al, Ti, W, Ni, Au, Co, Ta, Mo, Pd, PT. Ru, Ir, TiN, TaN, TaC, NbN, RuTa etc. In some embodiments, the gate electrode layers 130 made of the above metal materials can have an advantage in electrical resistivity over a similar structure formed of semiconductor materials. In the present embodiment, the gate electrode layers 130 form a plurality of word lines in the memory device 10.

Specifically, in the present embodiment, the metal materials have a lower electrical resistivity compared to the doped semiconductor materials, for example, doped polysilicon. In addition, the gate electrode layers 130 formed by the metal materials provide a lower electrical resistivity compared to the doped polysilicon without a need for temperature activation. Hence, the gate electrode layers 130 including the metal materials have an advantage for changing and discharging the gate capacitance of the memory cell such that a faster memory device is provided. Using the metal materials for forming the gate electrode layer 130 removes the carrier depletion effect commonly be found in, for example, the semiconductor materials such as polysilicon. The carrier depletion effect is also referred to as the poly depletion effect. The reduction of poly depletion effect in the gate electrode layers 130 is beneficial for improving data retention in the memory device 10.

As shown in FIG. 1B, the dielectric column including the first dielectric column 231 and the second dielectric column 232 has a semi-cylindrical shape. The lateral surfaces of the second dielectric column 232, the source electrode SE, and the drain electrode DN are respectively exposed from lateral edges of the gate electrode layer 130.

In some embodiments, the memory arc wall structures 210 can include memory material layers, for example, oxide/nitride/oxide (ONO) (e.g., $SiO_2/SiN/SiO_2$) memory material layers for storing charge in a non-volatile manner. As illustrated in FIG. 1A, the memory arc wall structure 210 are in contact with each of the insulating layers 120 and the gate electrode layers 130.

In some embodiments, the channel wall structures 220 include conducting semiconductor materials, for example, polysilicon. In some other embodiments, the channel wall structures 220 may also include other semiconductor materials, for example, indium gallium zinc oxide (IGZO), zinc oxide (ZnO), tin oxide ($SnO_2$), etc.

Referring to FIG. 1A, dielectric materials can be deposited on the channel wall structure 220 to form a dielectric column that may include the first dielectric column 231 and the second dielectric column 232 vertically extended therewith.

In some other embodiments, the first dielectric column 231 and the second dielectric column 232 can be respectively formed by different materials for etching selectivity. The first dielectric column 231 can be formed by high-k dielectric materials, for example, aluminum oxide (e.g., $Al_2O_3$), hafnium oxide (e.g., $HfO_2$), etc. In some embodiments, a thickness of the first dielectric column 231 can be ranged from about 20 nm to about 200 nm.

In some embodiments, the second dielectric column 232 can include low-k materials, for example, polysilocarb (e.g., SiOC), silicon carbide (e.g., SiC), or silicon oxynitride (SiON). In some embodiments, a thickness of the second dielectric column is preferably in a range from about 20 nm to about 200 nm. In the present embodiments, as recesses or trenches are desired to be selectively formed on the first dielectric column 231, due to the first dielectric column 231 and the second dielectric column 232 are respectively formed by the different dielectric materials, the first dielectric column 231 can be selectively etched.

Figure 1C:
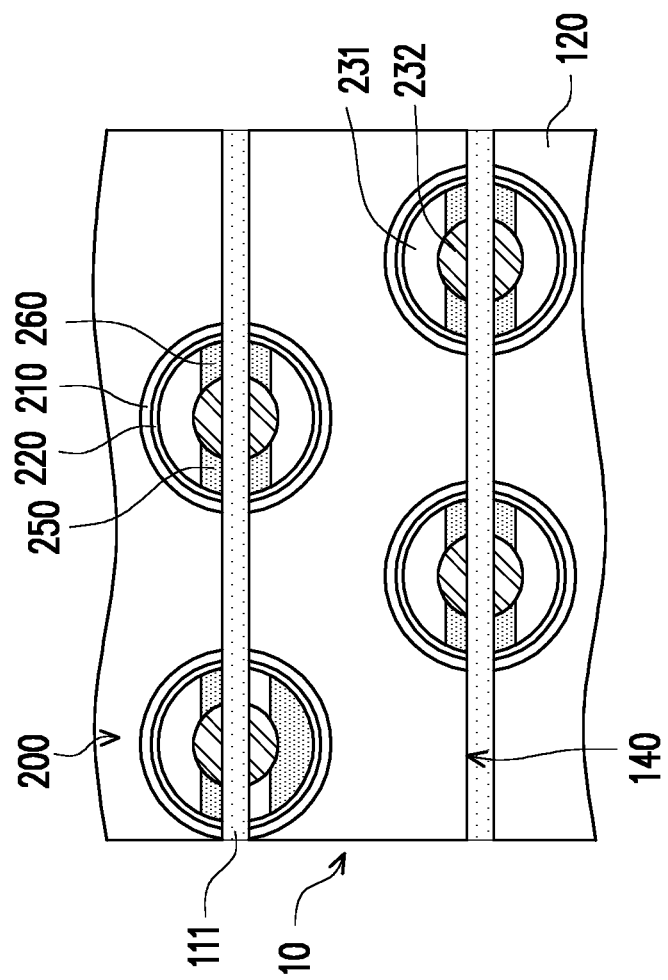
FIG. 1C is a schematic top view illustrating a memory device in accordance with some embodiments of the disclosure.

FIG. 1C is a schematic top view illustrating a memory device 10 in accordance with some embodiments of the disclosure. Referring to FIG. 1C, the memory cells 200 having the transistor structures are aligned along isolation trenches 140 that are the insulating portions for insulating the oppositely disposed memory cells 200. Namely, as shown in FIG. 1C, in the present embodiments, the memory cells 200 having semi-cylindrical shape can be separated and insulated through the isolation trenches 140 therebetween. Therefore, in the present embodiments, a cylindrical vertical memory structure can be separated and insulated into two memory cells 200 by isolation portions including the isolation trenches 140. Hence, more memory cells 200 can be accommodated in each unit area of the memory device 10 to enhance the distribution density of the memory cells 200.

Figures 2A, 2B:
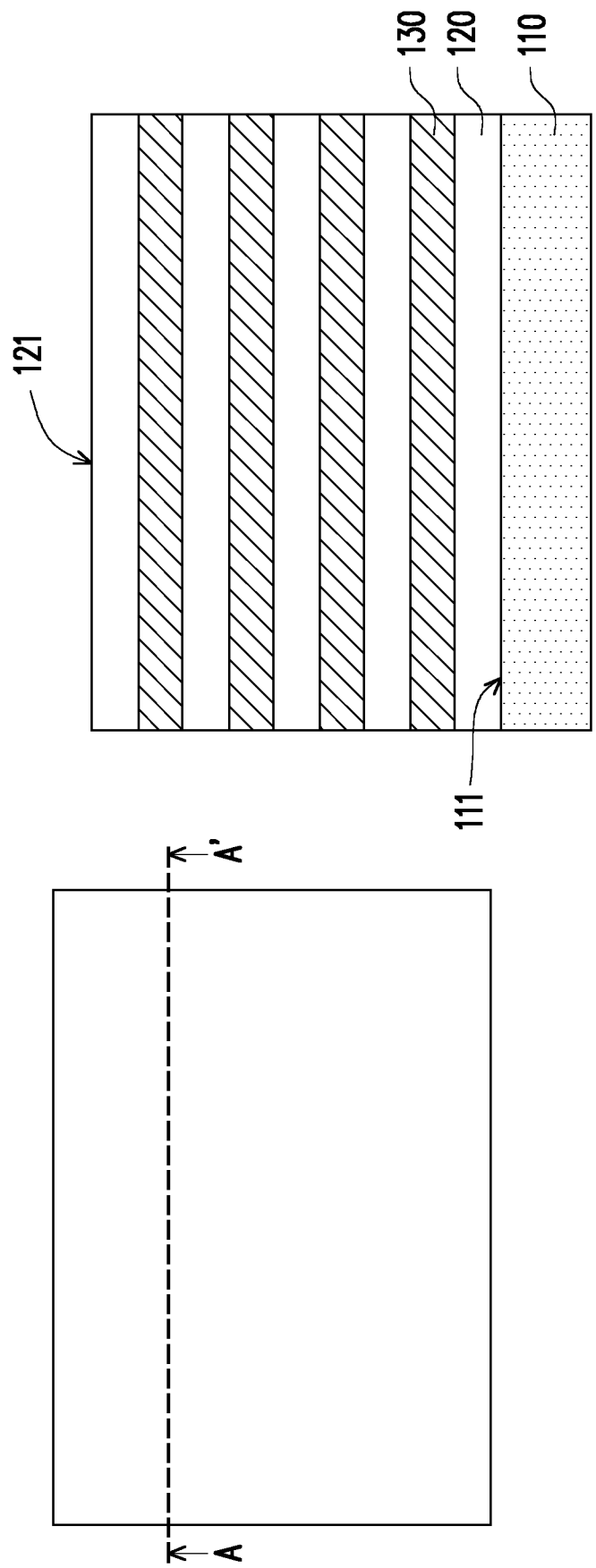
FIG. 2A is a schematic top view illustrating a memory device for a manufacturing step thereof in accordance with some embodiments of the disclosure.
FIG. 2B is a schematic cross-section view illustrating a memory device for a manufacturing step thereof along an AA' line in FIG. 2A in accordance with some embodiments of the disclosure.

FIG. 2A is a schematic top view illustrating a memory device 10 for a manufacturing step thereof in accordance with some embodiments of the disclosure. FIG. 2B is a schematic cross-section view illustrating a memory device 10 for a manufacturing step thereof along an AA' line in FIG. 2A in accordance with some embodiments of the disclosure. Referring to FIG. 2A and FIG. 2B, in some embodiments, a manufacturing process of memory device 10 includes firstly forming the substrate 110. In some embodiments, the substrate 110 may be formed by, for example, a semiconductor substrate. In some embodiments, the substrate 110 may be a wafer such as a blanket wafer or a layer applied to another base material, for example, an epitaxial layer grown onto a lower layer. Subsequently, the insulting layers 120 and the gate electrode layers 130 are deposited alternately above the substrate 110 along a direction perpendicular to a top surface 111 of the substrate 110 to form a stack including the insulting layers 120 and the gate electrode layers 130 in alternation.

In some embodiments, the stack of the insulating layers 120 and the gate electrode layers 130 can be formed by using suitable deposition techniques, for example, atomic layer deposition (ALD), physical vapor deposition (PVD), chemical vapor phase deposition (CVD). In some embodiments, the stack 10 may be formed by low pressure CVD (LPCVD) or alternative plasma enhanced CVD (PECVD). In the embodiments that the gate electrode layers 130 including the metal materials, the gate electrode layers 130 may be formed by, for example, metal evaporation, sputtering, chemical vapor deposition (CVD), atomic layer deposition (ALD).

Figure 2C:
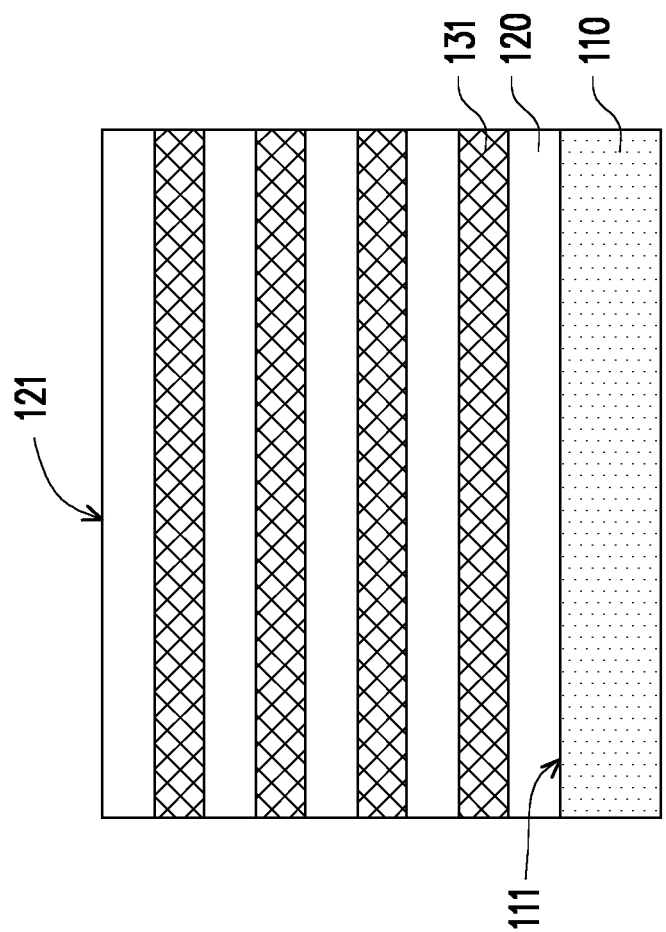
FIG. 2C is a schematic cross-section view illustrating a memory device for a manufacturing step thereof along an AA' line in FIG. 2A in accordance with some embodiments of the disclosure.

FIG. 2C is a schematic cross-section view illustrating a memory device 10 for a manufacturing step thereof along an AA' line in FIG. 2A in accordance with some embodiments of the disclosure. Referring to FIG. 2C, in an alternative embodiment, a replacement gate manufacturing process can be also applied for manufacturing the memory device 10. In the embodiment of utilizing the replacement gate manufacturing process, the insulting layers 120 can be firstly stacked with sacrificial material layers 131, for example, silicon nitride ($Si_3N_4$) layers that can be removed in a later manufacturing process.

Referring to FIG. 3A and FIG. 3B, the stack of the insulating layers 120 and the gate electrode layers 130 are etched to form the vertical holes 150. The vertical holes 150 are extended from a top surface 121 of the insulating layer 120 to the top surface 111 of the substrate 110. As illustrated in FIG. 3A and FIG. 3B, each of the vertical holes 150 can respectively expose a portion of the top surface 111 and is configured for accommodating the memory cells 200 formed in the present manufacturing process. In some embodiments not illustrated, depending on the shapes of the vertical holes 150, the sidewalls of the vertical holes 150 may also have different shapes. For example, the sidewalls of the vertical holes 150 may be a rectangular shape, a cylindrical shape, or an elliptical shape, the present embodiment is not limited herein. In some embodiments, the vertical holes 150 may be formed by suitable processes, for example, an etching process for forming a vertical through-hole structure throughout the stack of the insulating layers 120 and the gate electrode layers 130. In some embodiments, a width of each vertical holes 150 can be ranged from about 40 nm to about 400 nm.

Referring to FIG. 4A and FIG. 4B, in some embodiments, after forming the vertical holes 150 extended throughout the stack of the insulating layers 120 and the gate electrode layers 130, the memory arc wall structure 210 and the channel wall structure 220 are subsequently deposited on the side walls of the vertical holes 150 and the top surface 121 of the insulating layer 120. In the current manufacturing step, the portions of the top surface 111 exposed in the vertical holes 150 are covered by the memory wall arc structure 210 and the channel wall structure 220 subsequently deposited thereon. In addition, the memory arc wall structure 210 is in direct contact with each of the insulating layers 120 and the gate electrode layers 130.

In some embodiments, the memory arc wall structure 210 may be formed by $SiO_2$/SiN/$SiO_2$ (ONO) material layers. In some other embodiments, the ONO material layers may be replaced by ferroelectric material layers, such as a $H_2O$ layer. In some embodiments, the memory arc wall structure 210 may be deposited by suitable techniques such as atomic layer deposition (ALD) to allow a conformal and uniform of the layer.

In some embodiments, the channel wall structure 220 may be formed by semiconductor materials such as polysilicon. In some other embodiments, the channel wall structure 220 may be formed by an IGZO layer, a ZnO layer, or a SnO layer, etc.

Figure 5B:
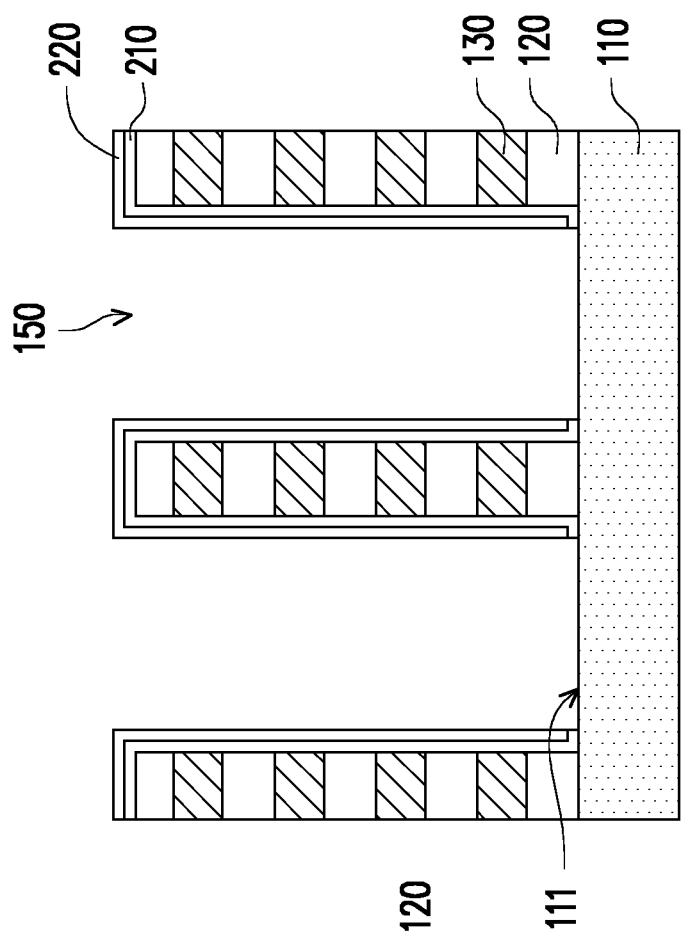
FIG. 5B is a schematic cross-section view illustrating a memory device for a manufacturing step thereof along an AA' line in FIG. 5A in accordance with some embodiments of the disclosure.
Figure 5A:
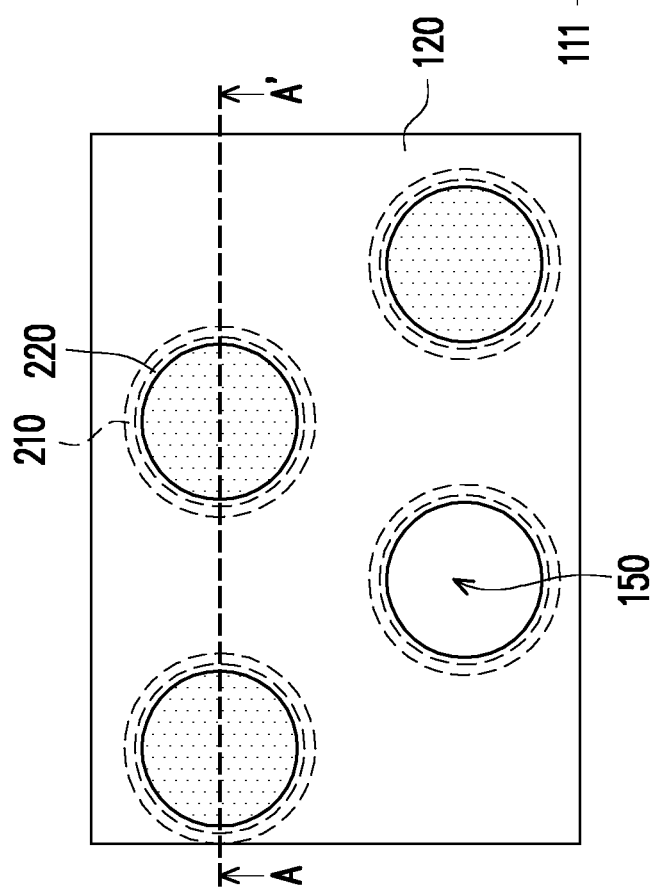
FIG. 5A is a schematic top view illustrating a memory device for a manufacturing step thereof in accordance with some embodiments of the disclosure.

FIG. 5A is a schematic top view illustrating a memory device for a manufacturing step thereof in accordance with some embodiments of the disclosure. FIG. 5B is a schematic cross-section view illustrating a memory device for a manufacturing step thereof along an AA' line in FIG. 5A in accordance with some embodiments of the disclosure. Referring to FIG. 5A and FIG. 5B, subsequently, the portions of the memory arc wall structure 210 and the portions of the channel wall structure 220 covering the top surface 111 of the substrate 110 are respectively etched and removed to expose the portion of the top surface 111 within each of the vertical holes 150. Through the above etching process, as shown in FIG. 5B, the memory arc wall structure 210 has an L shape at its bottom portion near the top surface 111, such that the channel wall structure 220 does not land on the top surface 111 of the substrate 110, but is separated from the substrate 110 by the memory arc wall structure 210. In some other embodiments not illustrated, before depositing the channel wall structure 220, the portion of the memory arc wall structure 210 on the top surface 111 can be firstly etched. As such, after the portion of the channel wall structure 220 on the top surface 111 being etched, there is no L shape is presented at bottom portion of the memory arc wall structure 210 near the top surface 111, but both the memory arc wall structure 210 and the channel wall structure 220 have vertical sidewalls that land on the top surface 111 of the substrate 110.

Figure 6B:
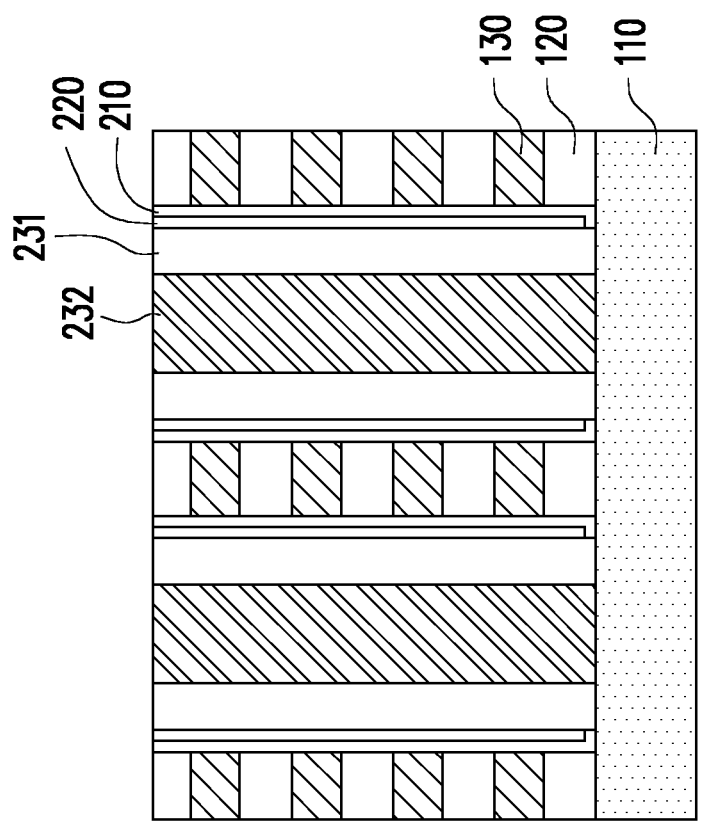
FIG. 6B is a schematic cross-section view illustrating a memory device for a manufacturing step thereof along an AA' line in FIG. 6A in accordance with some embodiments of the disclosure.
Figure 6A:
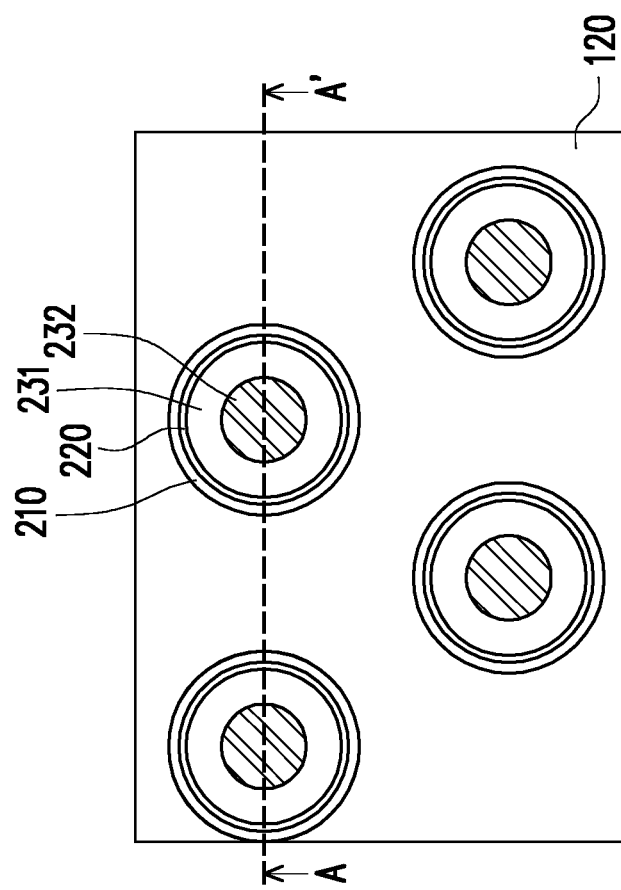
FIG. 6A is a schematic top view illustrating a memory device for a manufacturing step thereof in accordance with some embodiments of the disclosure.

FIG. 6A is a schematic top view illustrating a memory device for a manufacturing step thereof in accordance with some embodiments of the disclosure. FIG. 6B is a schematic cross-section view illustrating a memory device for a manufacturing step thereof along an AA' line in FIG. 6A in accordance with some embodiments of the disclosure. As the manufacturing step illustrated in FIG. 6A and FIG. 6B, a first dielectric column 231 and a second dielectric column 232 are subsequently disposed on the channel wall structure 220 and the top surface 111. Referring to FIG. 6A and FIG. 6B, the first dielectric column 231 and the second dielectric column 232 penetrate throughout the stack of the insulating layers 120 and the gate electrode layers 130 along the channel wall structure 220. In some embodiments, the first dielectric column 231 is formed by a first dielectric material including high-k materials, for example, aluminum oxide (e.g., $Al_2O_3$), hafnium oxide (e.g., $HfO_2$), or the combination thereof. Moreover, the first dielectric column 231 can be formed to have a thickness ranged from about 20 nm to about 200 nm.

As illustrated in FIG. 6A and FIG. 6B, in some embodiments, the second dielectric columns 232 are formed by low-k materials, for example, polysilocarb (e.g., SiOC), silicon carbide (e.g., SiC), or silicon oxynitride (SiON). In some embodiments, the second dielectric column 232 can be formed to have a thickness ranged from about 20 nm to about 200 nm.

After depositing the first dielectric column 231 and the second dielectric column 232, a planarization process is applied to remove excess materials of the first dielectric column 231, the second dielectric column 232, the memory arc wall structure 210, and the channel wall structure 220. As shown in FIG. 6B, after finishing the planarization process, the topmost insulating layers 120 is exposed and coplanar with the top surfaces of the first dielectric column 231, the second dielectric column 232, the memory arc wall structure 210, and the channel wall structure 220.

FIG. 7A is a schematic top view illustrating a manufacturing step of a memory array in accordance with some embodiments of the disclosure. FIG. 7B is a schematic cross-section view illustrating a manufacturing step of a memory array along a A-A' line shown in FIG. 7A in accordance with some embodiments of the disclosure. Referring to FIG. 7A and FIG. 7B, the stack of the insulating layers 120 and the gate electrode layers 130 is etched vertically and laterally along a line passing through the center of the vertical hole 150 to form the isolation trench 140. The isolation trench 140 is an insulating portion that divides the vertical structure formed in the vertical hole 150 into two memory cells 200 respectively having semi-cylindrical shapes and oppositely facing each other. As illustrated, the two opposite facing memory cells 200 are disposed at opposite sides of the isolation trench 140. In the present embodiment, the isolation trenches 140 are extended in parallel along the lateral direction of the stack of the insulating layers 120 and the gate electrode layers 130. In some other embodiments not illustrated, the isolation trenches 140 may be filled with the dielectric fillers such as $SiO_2$ or SiN for forming the isolation portion that insulates the adjacent memory cells 200.

FIG. 8A is a schematic top view illustrating a manufacturing step of a memory array in accordance with some embodiments of the disclosure. FIG. 8B is a schematic cross-section view illustrating a manufacturing step of a memory array along a A-A' line shown in FIG. 8A in accordance with some embodiments of the disclosure. Referring again to FIG. 2C, the stack of the insulating layers 120 and the sacrificial material layers 131 can also go through the manufacturing processes shown in FIG. 3A and FIG. 3B to FIG. 6A and FIG. 6B. Subsequently, referring to FIG. 8A and FIG. 8B, in this alternative embodiment, the sacrificial material layers 131 can be etched and removed by an immersion wet-etch process utilizing, for example, a hot phosphoric acid to form a plurality of etched gaps 132 between each two of the insulting layers 120.

FIG. 9A is a schematic top view illustrating a manufacturing step of a memory array in accordance with some embodiments of the disclosure. FIG. 9B is a schematic cross-section view illustrating a manufacturing step of a memory array along a A-A' line shown in FIG. 9A in accordance with some embodiments of the disclosure. Referring to FIG. 9A and FIG. 9B, in present embodiments, following formation of the etched gaps 132 as described with reference to FIG. 8A and FIG. 8B the etched gaps 132 formed between the adjacent insulating layers 120 may be filled with the gate metal materials such as titanium (Ti), titanium nitride (TiN), tungsten (W), tantalum nitride (TaN), copper (Cu) or the combination thereof to form the gate electrode layers 135 between the adjacent insulating layers 120.

Figure 10A:
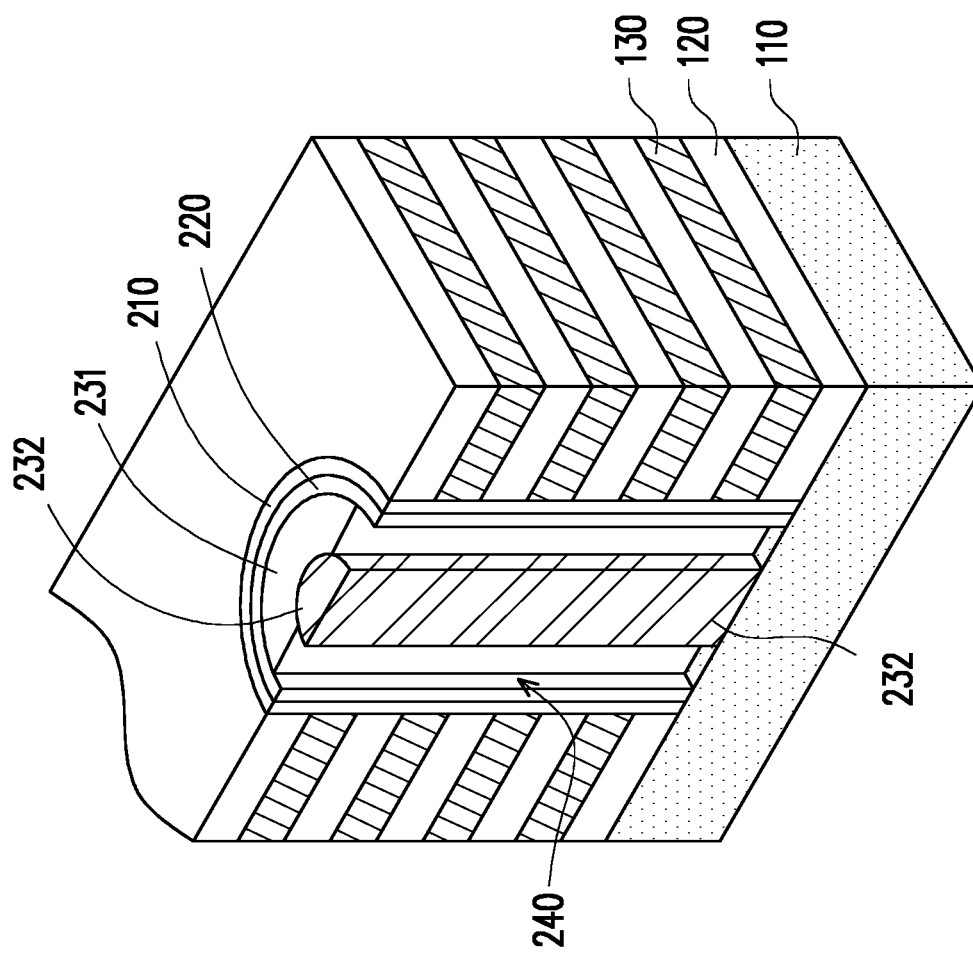
FIG. 10A is a schematic three-dimensional (3D) view illustrating a manufacturing step of a memory array in accordance with some embodiments of the disclosure.
Figure 10C:
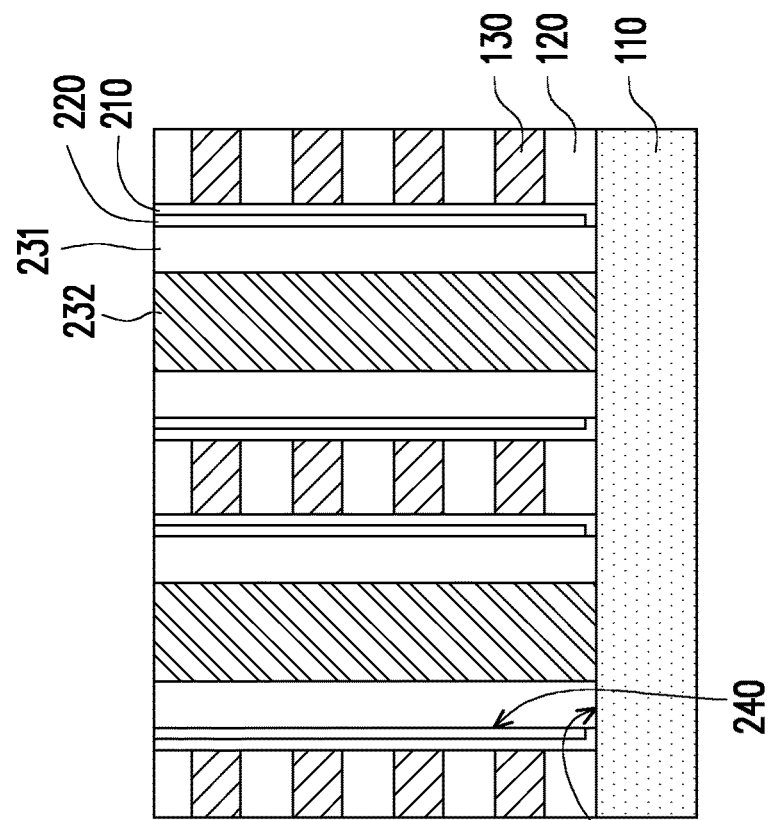
FIG. 10C is a schematic cross-section view illustrating a manufacturing step of a memory array along a A-A' line shown in FIG. 10B in accordance with some embodiments of the disclosure.
Figure 10B:
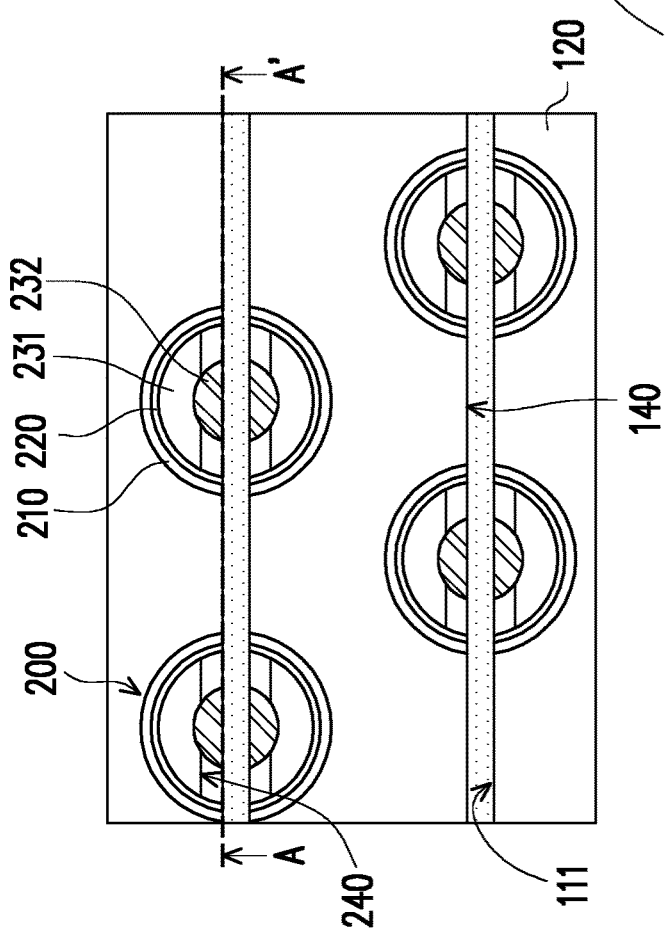
FIG. 10B is a schematic top view illustrating a manufacturing step of a memory array in accordance with some embodiments of the disclosure.

FIG. 10A is a schematic three-dimensional (3D) view illustrating a manufacturing step of a memory array in accordance with some embodiments of the disclosure. FIG. 10B is a schematic top view illustrating a manufacturing step of a memory array in accordance with some embodiments of the disclosure. FIG. 10C is a schematic cross-section view illustrating a manufacturing step of a memory array along a A-A' line shown in FIG. 10B in accordance with some embodiments of the disclosure. Referring to FIG. 10A, FIG. 10B, and FIG. 10C, the first dielectric column 231 in the respective memory cell 200 are etched to form the vertical trenches 240 vertically extended along the first dielectric column 231. As shown in FIG. 10A, the side walls of the second dielectric column 232 and the channel wall structure 220 are both partially exposed within the vertical trenches 240. In some embodiments, the first dielectric column 231 and the second dielectric column 232 may be formed by different dielectric materials that can have different etching rates. In the current embodiments, due to the different etching rates of the first dielectric column 231 and the second dielectric column 232 formed by different dielectric materials, the first dielectric column 231 can be selectively etched to form vertical trenches 240 extended along the second dielectric column 232 as illustrated in FIG. 10A.

Figure 11A:
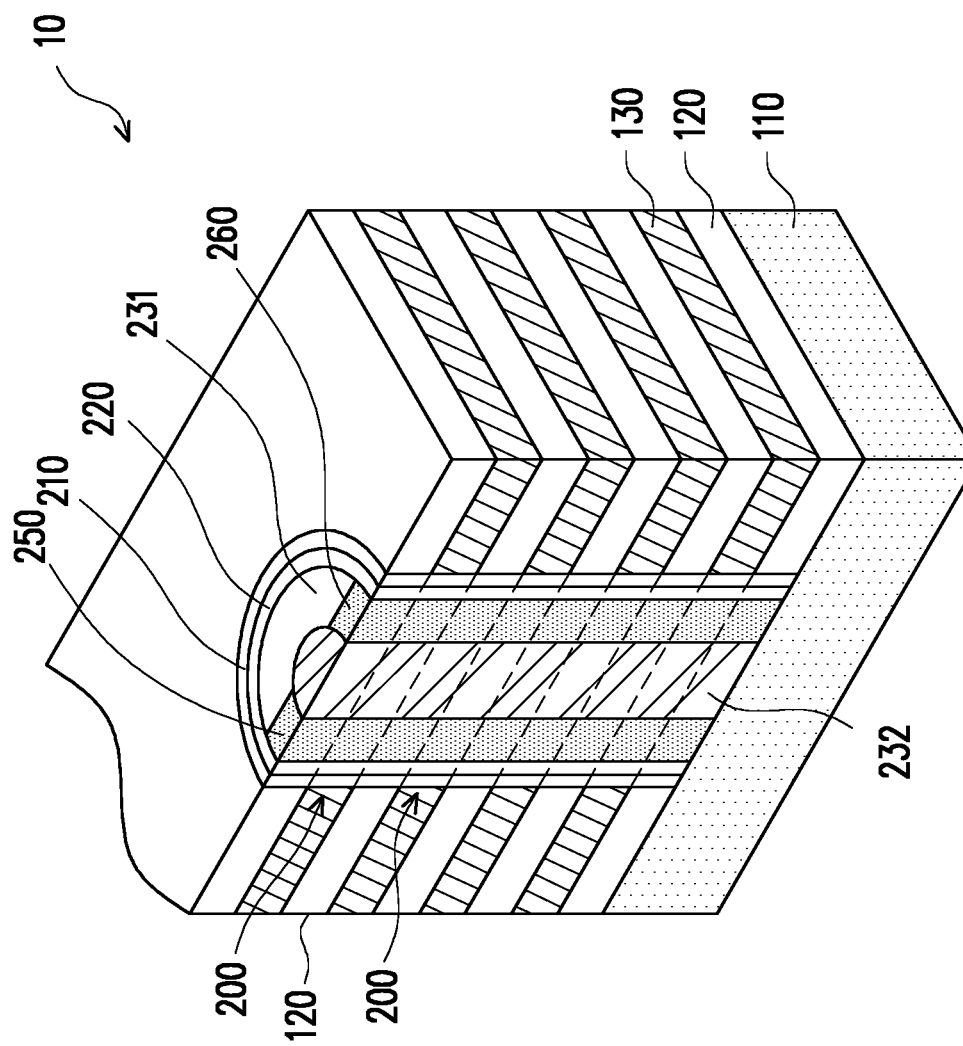
FIG. 11A is a schematic three-dimensional (3D) view illustrating a manufacturing step of a memory device in accordance with some embodiments of the disclosure.
Figures 11B, 11C:
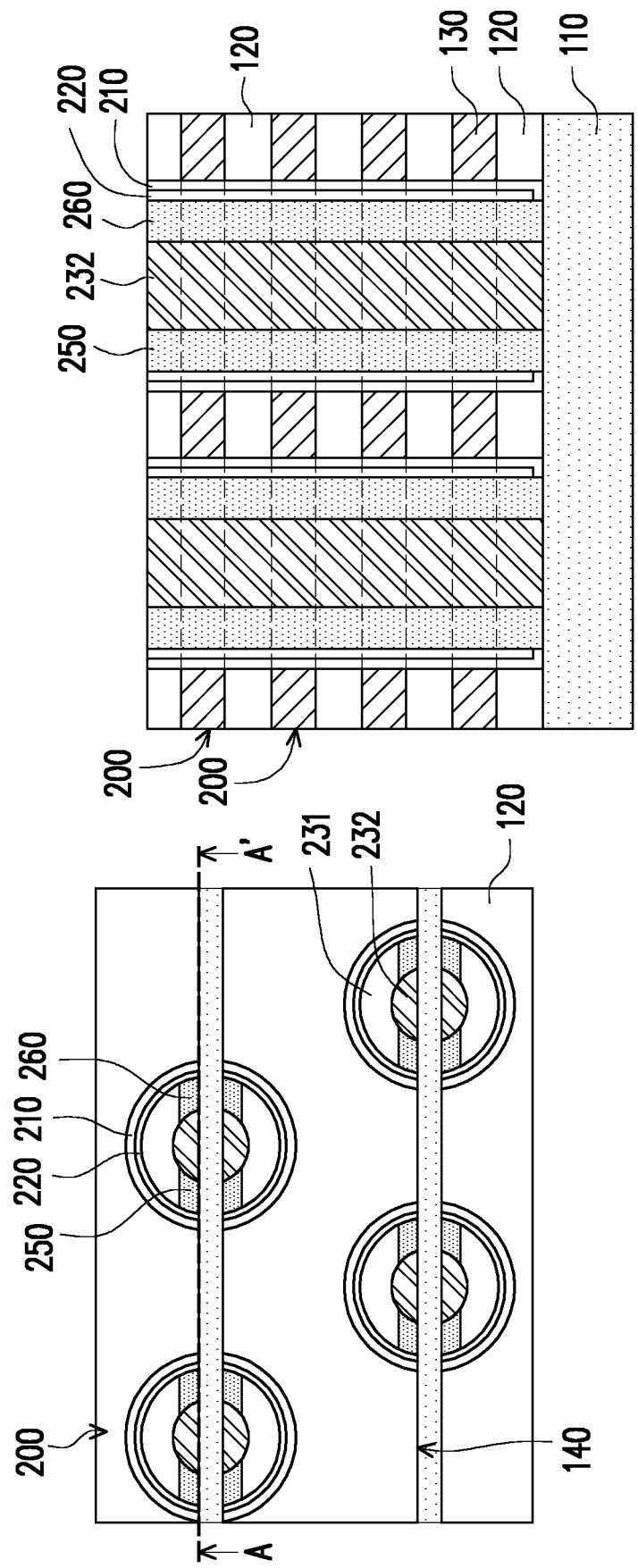
FIG. 11B is a schematic top view illustrating a manufacturing step of a memory device in accordance with some embodiments of the disclosure.
FIG. 11C is a schematic cross-section view illustrating a manufacturing step of a memory device along a A-A' line shown in FIG. 11B in accordance with some embodiments of the disclosure.

FIG. 11A is a schematic three-dimensional (3D) view illustrating a manufacturing step of a memory device 10 in accordance with some embodiments of the disclosure. FIG. 11B is a schematic top view illustrating a manufacturing step of a memory device in accordance with some embodiments of the disclosure. FIG. 11C is a schematic cross-section view illustrating a manufacturing step of a memory device along a A-A' line shown in FIG. 11B in accordance with some embodiments of the disclosure. Referring to FIG. 11A, FIG. 11B, and FIG. 11C, as illustrated, the vertical trenches 240 illustrated in FIG. 10A located at two opposite sides of the second dielectric column 231 and extended therewith are respectively filled with the conductive materials, for example, Ti, TiN, TaN, W, TaN, Cu, polysilicon, or the combination of the aforementioned materials for forming the bit line electrode 250 and the source line electrode 260. As illustrated in FIG. 11B and FIG. 11C, in the current manufacturing step, the memory cells 200 respectively having the transistor structure therein are respectively embedded in and surrounded by the gate electrode layers 130. As illustrated in FIG. 11A and FIG. 11C, each two adjacent memory cells 200 are electrically isolated by the insulating layers 120 disposed between.

Figures 12A, 12B:
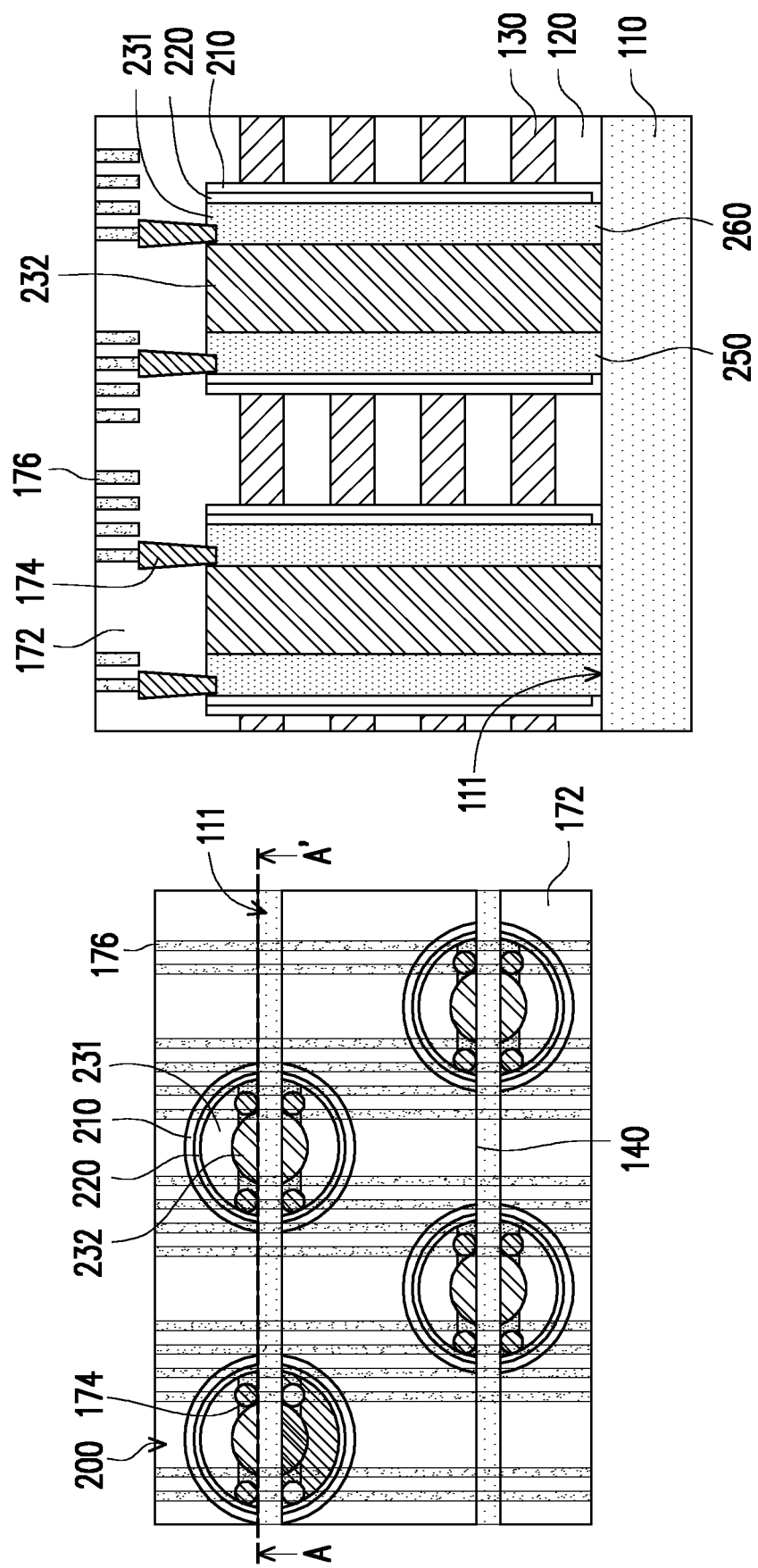
FIG. 12A is a schematic top view illustrating a memory device in accordance with some embodiments of the disclosure.
FIG. 12B is a schematic cross-section view illustrating a memory device along a A-A' line in FIG. 12A in accordance with some embodiments of the disclosure.

FIG. 12A is a schematic top view illustrating a memory device in accordance with some embodiments of the disclosure. FIG. 12B is a schematic cross-section view illustrating a memory device along a A-A' line in FIG. 12A in accordance with some embodiments of the disclosure. As illustrated in FIG. 12A and FIG. 12B, an encapsulating layer 172 formed by, for example a silicon oxide layer, is deposited above the stack of the insulating layers 120 and the gate electrode layers 130. Subsequently, a conductive material layer having a plurality of metal traces 176 are formed in the encapsulating layer 172 and partially exposed from a top surface thereof. The conductive connectors 174 are respectively formed between the metal traces 176 and the bit line electrode 250 and between the metal traces 176 and the source line electrode 260. Referring again to FIG. 12A, the memory cells 200 of the memory array are respectively aligned in the stack of the insulating layers 120 and the gate electrode layers 130. In some embodiments, the metal traces 176 are formed by, for example, copper traces, aluminum traces, or the combination thereof. After finishing the above steps, the manufacturing process of the memory device 10 is completed.

Figure 13:
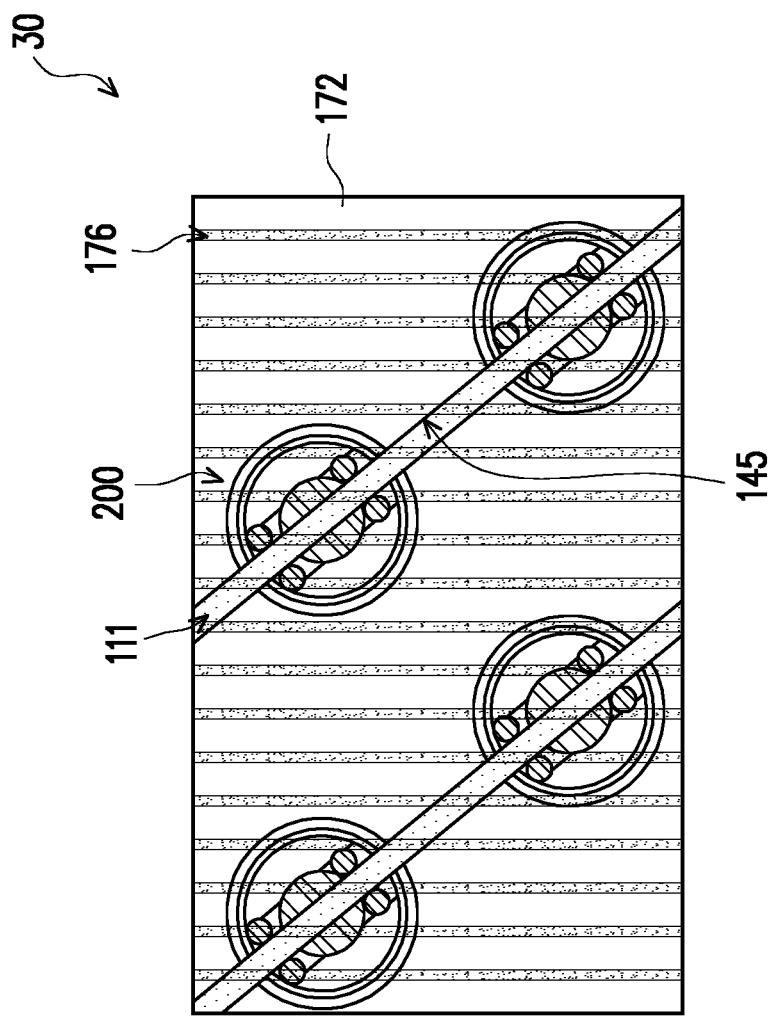
FIG. 13 is a schematic top view illustrating a memory array in accordance with some embodiments of the disclosure.

FIG. 13 is a schematic top view illustrating a memory array in accordance with some embodiments of the disclosure. In some embodiments, the memory array of the memory device 10 can have a plurality of isolation trenches 145 that are insulating portions aligned along bevel directions relative to the lateral edges of the stack of the insulating layers 120 and the gate electrode layers 130. As illustrated, the adjacent and opposite facing memory cells 200 of the memory array are respectively disposed along each of the isolation trenches 145.

Figure 14A:
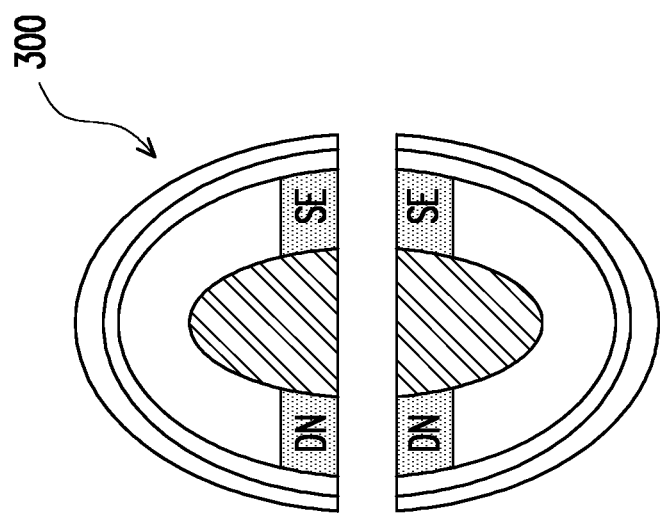
FIG. 14A is a schematic top view illustrating a memory array in accordance with some embodiments of the disclosure.
Figure 14B:
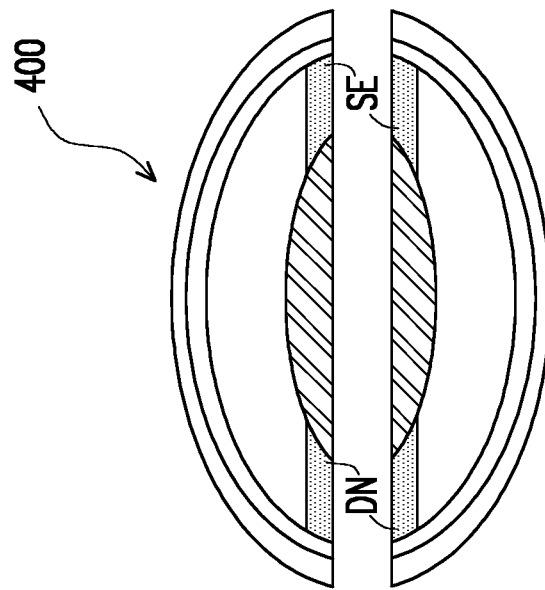
FIG. 14B is a schematic top view illustrating a memory array in accordance with some embodiments of the disclosure.

FIG. 14A is a schematic top view illustrating a memory array in accordance with some embodiments of the disclosure. FIG. 14B is a schematic top view illustrating a memory array in accordance with some embodiments of the disclosure. As illustrated in FIG. 14A, in some embodiments, memory cells 300 may have a vertical semi-elliptical shape. In addition, as illustrated in FIG. 14B, in some embodiments, memory cells may have a horizontal semi-elliptical shape. The shapes of the memory cells 300 and 400 are not limited herein, in some other embodiments not illustrated, the shapes of the memory cells 300 and 400 may be other suitable shapes, such as a rectangular shape.

Referring again FIG. 1A to FIG. 1C, the benefit of the memory cell 200 of the memory device 10 enhanced from the conventional cylindrical vertical structure (i.e., gate-all-around (GAA) structure) can lie in the number of bits which can be stored. As illustrated in FIG. 1A to FIG. 1C, in the case of the memory cell 200, 1 bit may be stored per memory cell 200. That is, in each of the memory cells 200 disposed along the isolation trenches 140, 1 bit can be stored therein. As such, in the present embodiment, by increasing the number of the memory cells 200 disposed in a unit area of the memory device 10, the memory cell 200 having the semi-cylindrical shape can achieve a memory device 10 having high cell density. That is, the memory device 10 can have at least two times dense than a memory device having a conventional GAA structure. Hence, in the present embodiments, more bits can be stored in a unit space of the memory device 10, also a considerable reduction in cell size can be realized to enlarge memory density in the memory device 10, and the advantages of the GAA structure such as enhancing the efficiency of programming and erase operation still can be well kept in the memory device 10.

In accordance with some embodiments, a memory device includes a plurality of transistor structures and memory arc wall structures. The memory arc wall structures are respectively embedded in the transistor structures. Each of the transistor structures includes a dielectric column, a source electrode and a drain electrode, a gate electrode layer, and a channel wall structure. The source electrode and the drain electrode are located on opposite sides of the dielectric column. The gate electrode layer is around the dielectric column, the source electrode, and the drain electrode. The channel wall structure is extended from the source electrode to the drain electrode and surrounds the dielectric column. The channel wall structure is disposed between the gate electrode layer and the source electrode, between the gate electrode layer, and the drain electrode, and between the gate electrode layer and the dielectric column. The memory arc wall structure is extended on and throughout the channel wall structure and sandwiched between the gate electrode layer and the channel wall structure. The dielectric column has a semi-cylindrical shape, and lateral surfaces of the dielectric column, the source electrode, and the drain electrode are respectively exposed from lateral edges of the gate electrode layer.

In accordance with some embodiments, a memory structure includes a stack of insulating layers and gate electrode layers, a first dielectric column, a source electrode and a drain electrode, a second dielectric column, a memory arc wall structure, and a channel wall structure. The stack of the insulating layers and the gate electrode layers are stacked in alteration. The first dielectric column penetrates through the stack. The source electrode and the drain electrode are disposed on the opposite sides of the first dielectric column. The second dielectric column penetrates through the stack. The second dielectric is disposed alongside the first dielectric column and the source electrode and the drain electrode. The memory arc wall structure penetrates through the stack. The memory arc wall structure is disposed around the second dielectric column and extend from the source electrode to the drain electrode. The channel wall structure penetrates through the stack. The channel wall structure is surrounded by memory wall structure and disposed between the memory wall structure and the source electrode and the drain electrode. The channel wall structure connects the source electrode and the drain electrode. The memory wall arc structure is sandwiched between the gate electrode layers and the channel wall structure. The second dielectric column has a semi-cylindrical shape, and lateral surfaces of the dielectric column, the source electrode, and the drain electrode are respectively exposed from a lateral edge of the stack.

In accordance with some embodiments, a memory device includes forming a substrate and forming a plurality of insulating layers, a plurality of gate electrode layers, a plurality of vertical trenches, memory arc wall structures, channel wall structures, dielectric columns, bit line electrodes, and source line electrodes. The insulting layers and the gate electrode layers are alternatively formed and stacked above the substrate. The vertical trenches are vertically throughout the insulating layers and the gate electrode layers. Memory arc wall structures are extended vertically throughout the insulating layers and the gate electrode layers to the substrate. Moreover, the channel wall structures are formed on the memory arc wall structures and vertically extended throughout the insulating layers and the gate electrode layers to the substrate. The dielectric columns are extended vertically along the channel wall structure. The bit line electrodes and the source line electrodes are vertically extended along the channel wall structures and peripherally surrounded by the dielectric columns. The channel wall structures are vertically extended along each of the vertical trenches. The bit line electrodes and the source line electrodes are respectively connected with the channel wall structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a memory device, comprising:
   forming a substrate;
   forming a plurality of insulating layers and gate electrode layers alternatively stacked above the substrate;
   forming a plurality of vertical trenches throughout the plurality of insulating layers and the plurality of gate electrode layers;

forming memory arc wall structures extended vertically throughout the insulating layers and the gate electrode layers to the substrate;

forming channel wall structures on the memory arc wall structures and vertically extended throughout the insulating layers and the gate electrode layers to the substrate;

forming dielectric columns extended vertically along the channel wall structures; and forming bit line electrodes and source line electrodes vertically extended along the channel wall structures and peripherally surrounded by the dielectric columns, wherein the channel wall structures are vertically extended along each of the vertical trenches, and the bit line electrodes and the source line electrodes are respectively connected with the channel wall structures.

2. The manufacturing method of claim 1, wherein the step of forming the dielectric columns comprises forming first dielectric columns and second dielectric columns on the channel wall structures, wherein the first dielectric columns are vertically extended along each of the vertical trenches, and the second dielectric columns are disposed between the bit line electrode and the source line electrode, and wherein the first dielectric columns, the bit line electrodes, and the source line electrodes peripherally surround the second dielectric columns.

3. The manufacturing method of claim 2, wherein the first dielectric columns are formed by oxide materials comprising hafnium oxide, aluminum oxide, or the combination thereof.

4. The manufacturing method of claim 2, wherein the second dielectric columns are formed by materials comprising silicon oxide, silicon carbide, silicon oxynitride, or the combination thereof.

5. The manufacturing method of claim 1, wherein the step of forming the gate electrode layers further comprises:
forming a plurality of silicon nitride-based material layers alternating with the insulating layers;
etching the silicon nitride-based material layers to form a plurality of etched gaps sandwiched between the insulating layers; and
filling conductive materials into the etched gaps to form the gate electrode layers.

6. The manufacturing method of claim 1, further comprising forming a conductive layer above the insulating layers and the gate electrode layers, wherein the conductive layer is electrically connected to the source line electrodes and the bit line electrodes.

7. The manufacturing method of claim 1, further comprising etching the insulating layers and the gate electrode layers to form a plurality of isolation trenches between the memory arc wall structures oppositely disposed.

8. The manufacturing method of claim 1, wherein the memory arc wall structure comprises an oxide-nitride-oxide layer or a ferroelectric material layer.

9. A manufacturing method of a memory structure, comprising:
forming a substrate;
forming alternative stacked layers above the substrate;
forming a vertical trench penetrated through the alternative stacked layers;
forming a memory arc wall structure penetrated through the alternative stacked layers along the vertical trench;
forming a channel wall structure on the memory arc wall structure along the vertical trench;
forming subsequently a first dielectric column and a second dielectric column extended vertically along the channel wall structure; and
forming a source electrode and a drain electrode on opposite ends of the first dielectric column,
wherein the second dielectric column is located alongside the first dielectric column and between the source electrode and the drain electrode, wherein the source electrode and the drain electrode are formed on opposite horizontal sides of the second dielectric column,
wherein the memory arc wall structure is located around the second dielectric column and extended from the source electrode to the drain electrode,
wherein the channel wall structure is surrounded by the memory arc wall structure and located between the memory arc wall structure and the first dielectric column,
wherein the channel wall structure is connected to the drain electrode and the source electrode, and the memory wall arc structure is sandwiched between the alternative stacked layers and the channel wall structure.

10. The manufacturing method of claim 9, wherein lateral surfaces of the second dielectric column, the source electrode, and the drain electrode are respectively exposed from a lateral edge of the alternative stacked layers.

11. The manufacturing method of claim 9, wherein the first dielectric column is formed on the channel wall structure and vertically extended therewith,
wherein the second dielectric column is peripherally surrounded by the source electrode, the drain electrode, and the first dielectric column.

12. The manufacturing method of claim 9, wherein
a plurality of memory cells are respectively formed in overlapping regions of the gate electrode layers and the memory arc wall structure, and
a plurality of insulating trenches are formed and extended between the memory cells,
wherein the memory cells are disposed oppositely and symmetrically along the insulating trenches.

13. The manufacturing method of claim 12, wherein the alternative stacked layers comprise insulating layers and gate electrode layers alternatively and vertically stacked with each other.

14. The manufacturing method of claim 13, wherein the insulating trenches are respectively formed and extended along bevel directions in relative to lateral edges of the insulating layers and the gate electrode layers.

15. The manufacturing method of claim 13, wherein the insulating trenches are respectively formed and extended parallelly along the lateral edges of the insulating layers and the gate electrode layers.

16. A manufacturing method of a memory device, comprising:
forming a substrate; and
forming a stack of tiers of memory cells above the substrate,
wherein the step of forming each of the memory cells comprises:
forming an alternative stack of insulating layers and gate electrode layers above the substrate;
forming a vertical trench penetrated through the alternative stack of insulating layers and gate electrode layers;
forming a memory arc wall structure extended along the vertical trench;

forming a channel wall structure on the memory arc wall structure along the vertical trench;

forming a dielectric column extended vertically along the channel wall structure; and forming a source electrode and a drain electrode respectively embedded in the dielectric column, wherein the memory arc wall structure is extended throughout the channel wall structure and sandwiched between the gate electrode layer and the chancel wall structure, wherein the lateral surfaces of the dielectric column, the source electrode, and the drain electrode are respectively exposed from lateral edges of the gate electrode layer.

17. The manufacturing method of claim 16, wherein the step of forming the dielectric column further comprises sequentially forming a first dielectric column and a second dielectric column, wherein the drain electrode and the source electrode are disposed on opposite horizontal sides of the second dielectric column, wherein the first dielectric column, vertically extending along the channel wall structure, is disposed between the channel wall structure and the second dielectric column.

18. The manufacturing method of claim 17, wherein a forming material of the first dielectric column is different from a forming material of the second dielectric column.

19. The manufacturing method of claim 16, wherein the gate electrode layer is formed of a metal material selected from the group comprising Ti, Cu, Au, Al, W, Ni, Co, Ta, Mo, Pd, Pt, Ag, TaN, TiN, TaC, or the combination thereof.

20. The manufacturing method of claim 16, further comprising forming a plurality of insulating portions respectively extended between the memory cells oppositely disposed.

* * * * *